(12) United States Patent
Lehmann et al.

(10) Patent No.: US 6,693,024 B2
(45) Date of Patent: Feb. 17, 2004

(54) SEMICONDUCTOR COMPONENT WITH A SEMICONDUCTOR BODY HAVING A MULTIPLICITY OF PORES AND METHOD FOR FABRICATING

(75) Inventors: Volker Lehmann, München (DE); Axel Schubert, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/165,936

(22) Filed: Jun. 10, 2002

(65) Prior Publication Data

US 2002/0197832 A1 Dec. 26, 2002

(30) Foreign Application Priority Data

Jun. 8, 2001 (DE) .......................... 101 27 950

(51) Int. Cl.[7] .................. H01L 21/225; H01L 23/48
(52) U.S. Cl. ............... 438/542; 438/675; 438/684; 438/960; 257/3; 257/774
(58) Field of Search ................. 438/409, 542, 438/667, 675, 684, 960, 212, 268, 273; 257/1, 3, 4, 302, 774

(56) References Cited

U.S. PATENT DOCUMENTS

| 4,505,799 | A | * | 3/1985 | Baxter ................. 204/416 |
|---|---|---|---|---|
| 4,874,484 | A | | 10/1989 | Foell et al. |
| 5,236,854 | A | * | 8/1993 | Higaki ................. 437/44 |
| 5,359,214 | A | | 10/1994 | Kurtz et al. |
| 5,614,743 | A | * | 3/1997 | Mochizuki ............ 257/276 |
| 5,644,156 | A | * | 7/1997 | Suzuki et al. .......... 257/485 |
| 5,759,903 | A | * | 6/1998 | Lehmann et al. ....... 438/386 |
| 6,180,965 | B1 | * | 1/2001 | Terasawa .............. 257/144 |
| 6,228,734 | B1 | * | 5/2001 | Bliss et al. ........... 438/379 |
| 6,355,950 | B1 | * | 3/2002 | Livengood et al. ..... 257/276 |
| 6,579,782 | B2 | * | 6/2003 | Roy .................... 438/561 |

OTHER PUBLICATIONS

Stengl, J.P. et al.: "Leistungs–MOS–FET–Praxis" [Power MOSFETs in Practice], Pflaum Verlag, Munich 1992, p. 37.

* cited by examiner

*Primary Examiner*—Carl Whitehead, Jr.
*Assistant Examiner*—Stephen W. Smoot
(74) *Attorney, Agent, or Firm*—Laurence A. Greenberg; Werner H. Stemer; Ralph E. Locher

(57) ABSTRACT

The semiconductor component is fabricated on the basis of a semiconductor body with a first and a second surface. A multiplicity of pores are formed in the semiconductor body. The pores extend into the semiconductor body proceeding from the first surface and ending below the second surface. The electrical conductivity of the semiconductor body, that is of the component, is increased in the region of the pores. The corresponding semiconductor component has connection contacts on the first and second surfaces.

11 Claims, 6 Drawing Sheets

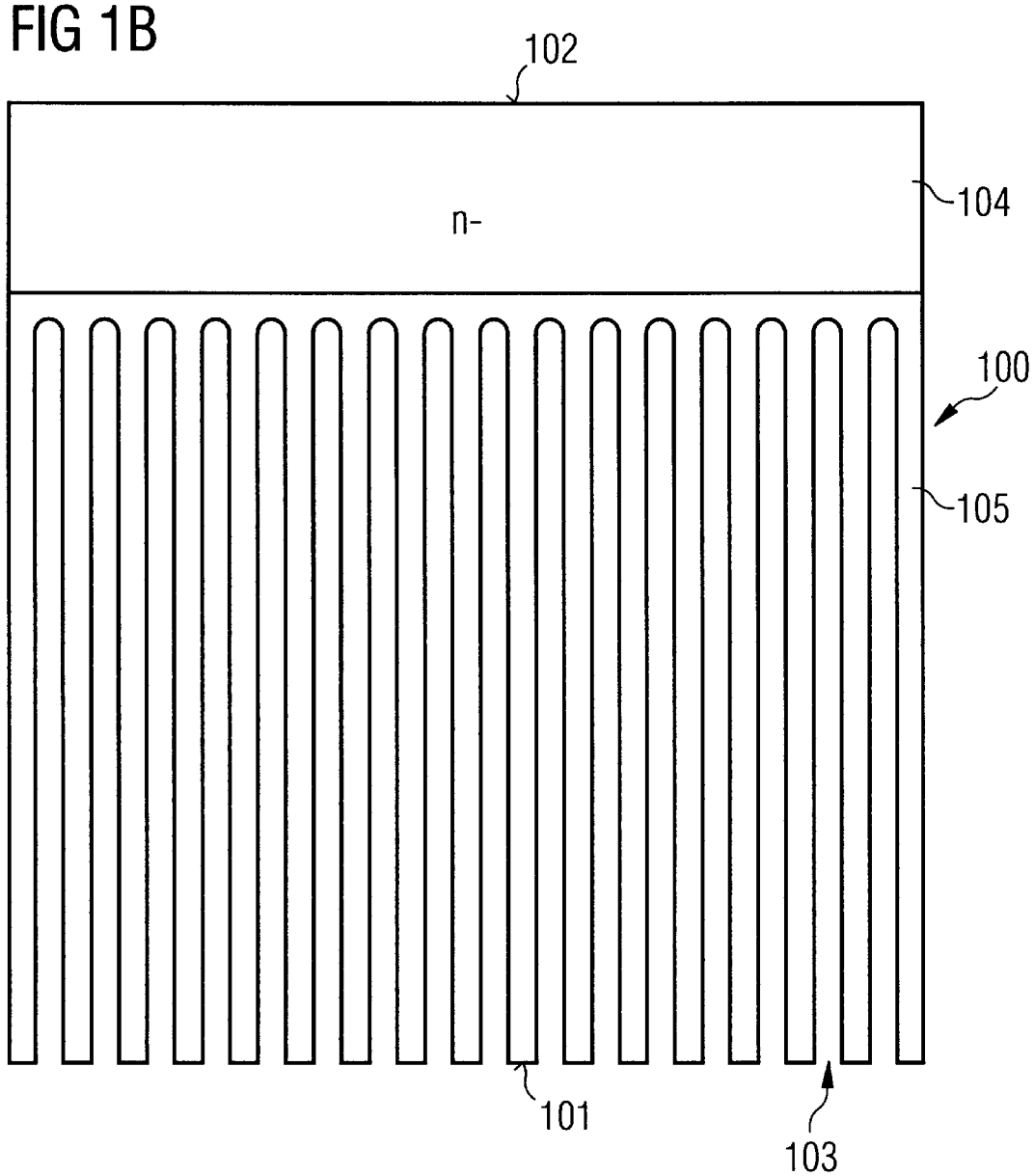

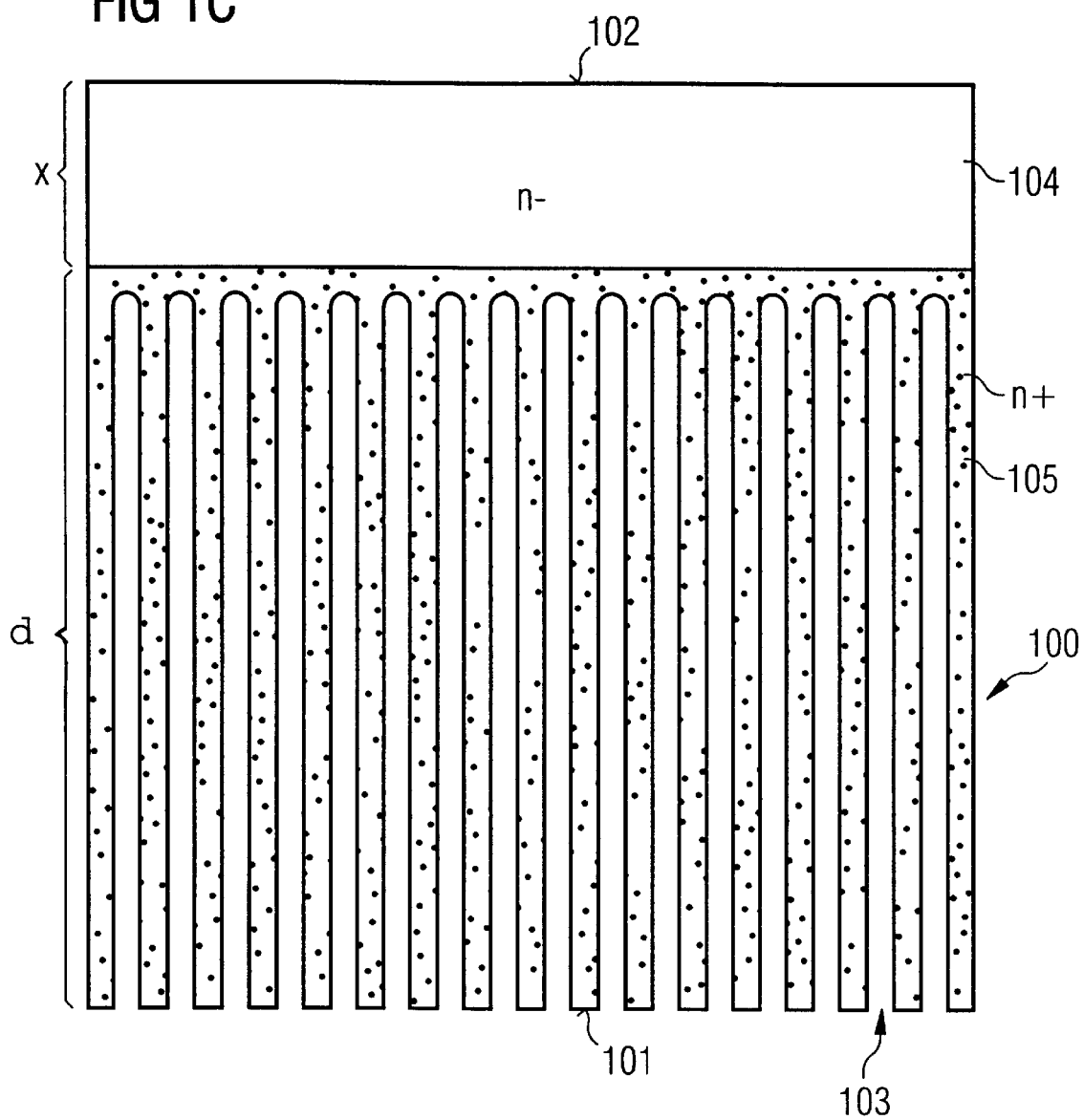

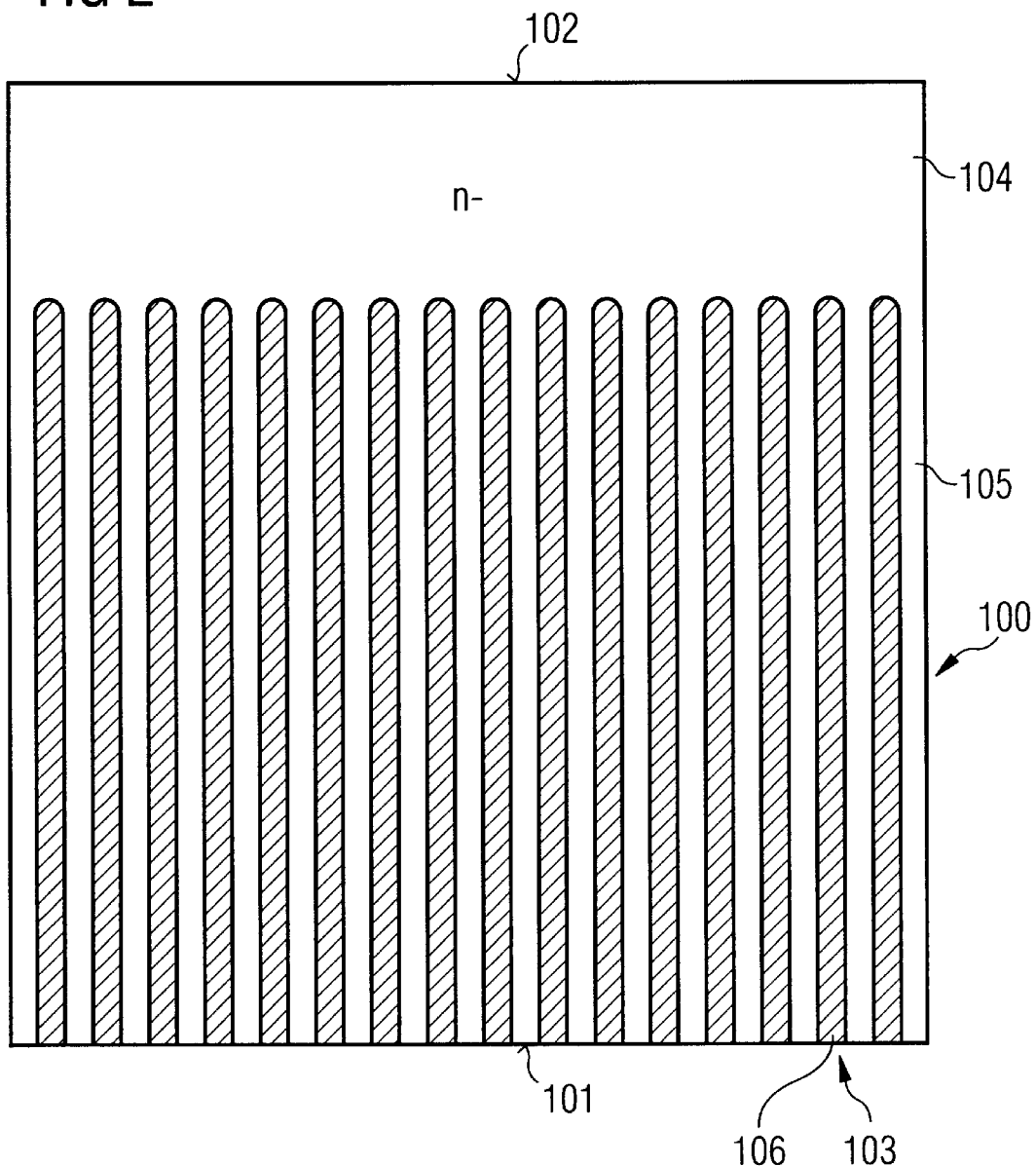

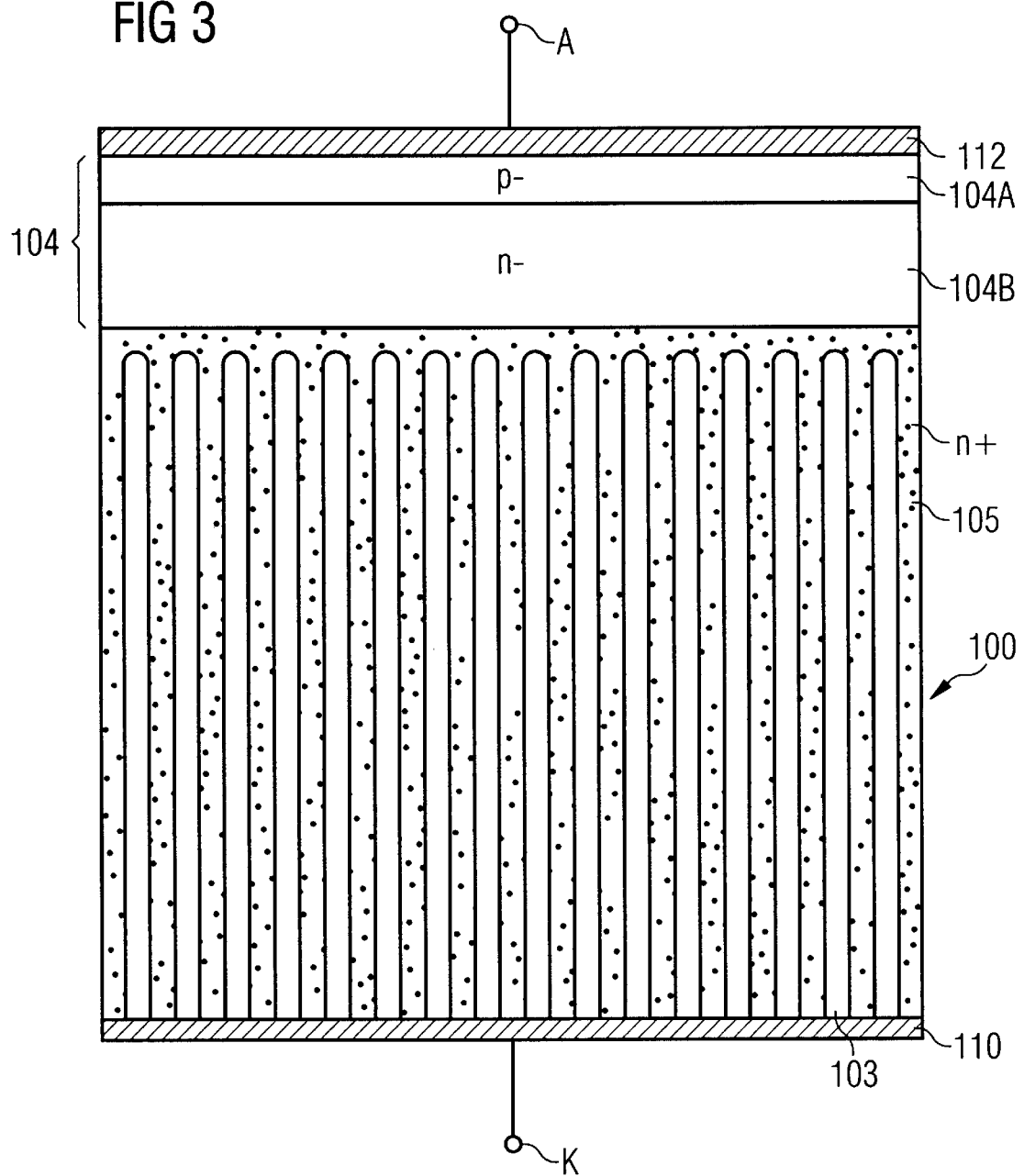

SEMICONDUCTOR COMPONENT WITH A SEMICONDUCTOR BODY HAVING A MULTIPLICITY OF PORES AND METHOD FOR FABRICATING

BACKGROUND OF THE INVENTION

Field of the Invention

The invention lies in the semiconductor technology field. More specifically, the present invention relates to a semiconductor component which is integrated in a semiconductor body or chip having a first and a second surface. Connection contacts are arranged at the surfaces for making contact with the semiconductor component.

Such a semiconductor component is, for example, a vertical transistor as it is described in Stengl/Tihanyi: "Leistungs-MOS-FET-Praxis" [Power MOSFETs in Practice], Pflaum Verlag, Munich 1992, page 37. That transistor has a heavily n-doped semiconductor substrate on which a more weakly n-doped epitaxial layer is applied. Arranged in the epitaxial layer are p-doped body zones wherein, in turn, n-doped source zones are arranged. In that component, contact is made with the source and body zones at a front side of the semiconductor body formed by the substrate and the epitaxial layer. The substrate forms a drain zone of the transistor, with which zone contact is made at a rear side of the semiconductor body.

The thickness and the doping of the epitaxial layer which acts as drift zone crucially determine the electrical properties of the known component, in particular the reverse voltage thereof and the on resistance thereof. The substrate on which the epitaxial layer is applied is doped as highly as possible in order to influence the on resistance as little as possible.

The heavily doped substrate essentially serves as a carrier and is required in order to be able to handle, during the fabrication method, a wafer wherein a multiplicity of such transistors are fabricated and from which the chips with the transistors are sawn at the-end of the fabrication method. A wafer having exclusively the thickness of the drift zone which determines the electrical properties is sufficient in theory, but in practice cannot be handled for the fabrication of the transistor since the thickness of the drift zone is usually so small that such a wafer would be completely unstable.

Further generally known vertical semiconductor components with connections at opposite surfaces of a semiconductor body are diodes which, for stability reasons, usually likewise have a substrate which is a good electrical conductor and to which—for example by means of epitaxy—semiconductor layers are applied which form a pn junction and whose doping and dimensions determine the electrical properties of the diode.

In order, on the one hand, to ensure sufficient mechanical stability of the wafer during fabrication, which can only be ensured by means of a certain thickness, and, on the other hand, to minimize the effects of this thickness required for fabrication on the component, further procedures are generally known in addition to the abovementioned possibility of applying epitaxial layers which determine the electrical properties to a substrate which is a good conductor.

Thus, it is generally known to provide a wafer having a doping which satisfies the requirements made of the doping in regions of the semiconductor component, for example the drift zone, and subsequently to thin the wafer in the regions which influence the electrical properties of the component.

Furthermore, it is generally known, if the intention is to dispense with an epitaxy, to use a more weakly doped wafer and to dope the wafer from a rear side by means of a deep diffusion, in order thus to produce a low resistance of the wafer in the regions which only contribute to the mechanical stability, and in order that contact can be made with semiconductor components formed above these regions from the rear side in a low-impedance manner.

SUMMARY OF THE INVENTION

It is accordingly an object of the invention to provide a method of fabricating a semiconductor component, which overcomes the above-mentioned disadvantages of the heretofore-known devices and methods of this general type and which provides for a process wherein a wafer wherein a multiplicity of components are fabricated is permitted to have a thickness which suffices for handling the wafer during the fabrication method, and wherein that region of the wafer or of the later chip which does not form an active region of the component has a low electrical resistance.

With the foregoing and other objects in view there is provided, in accordance with the invention, a method of fabricating a semiconductor component, which comprises the following steps:

providing a semiconductor body having a first and a second surface;

fabricating a multiplicity of pores in the semiconductor body, the pores proceeding from the first surface, extending into the semiconductor body, and ending below the second surface; and increasing an electrical conductivity of the semiconductor body in the region of the pores.

In accordance with an added feature of the invention, regions of the semiconductor body that are uncovered in the pores are doped. In addition, diffusion may be carried out after the doping.

In accordance with another feature of the invention, the pores are at least partly filled with an electrically conductive material, such as a metal or a polysilicon.

With the above and other objects in view there is also provided, in accordance with the invention, a semiconductor component, comprising:

a semiconductor body having a first surface and a second surface each having connection contacts;

the semiconductor body having a multiplicity of pores formed therein extending into the semiconductor body, proceeding from the first surface and ending below the second surface, and wherein an electrical conductivity is increased in a region of the pores.

In other words, the novel method for fabricating a semiconductor component provides for a semiconductor body having a first and a second surface to be provided and for a multiplicity of pores to be produced which extend into the semiconductor body proceeding from the first surface and which end below the second surface. The electrical conductivity of the semiconductor body is subsequently increased in the region of the pores. This is done, for example, by indiffusion of dopant atoms into regions of the semiconductor body which are uncovered in the pores, and/or by filling the pores with an electrically conductive material, in particular a metal or polysilicon.

That region of the semiconductor body below the second surface which is not permeated by the pores can be utilized for realizing the active regions of the actual semiconductor components, for example a diode or a transistor. These active regions can be fabricated before the production of the pores or after the production of the pores. The depth to which the pores are introduced into the semiconductor body proceeding from the first surface is coordinated with the thickness of the semiconductor body or of the wafer which forms a multiplicity of the later semiconductor bodies/chips in such a way that a semiconductor layer having a thickness suitable for the realization of the desired component remains between that end of the pores which lies in the semiconductor body and the second surface. In this case, the method according to the invention is suitable in particular in the fabrication of PIN photodiodes.

The values for the penetration of the pores into the semiconductor body lie, for example, in the range of between 50% and 95% of the total thickness of the semiconductor body in the direction of the pores.

Electrically, the semiconductor body whose electrical conductivity has been increased in the region of the pores behaves approximately like a thin substrate which only has the thickness of that layer of the semiconductor body which is not permeated by pores, and with which contact can be made from the second surface of the semiconductor body via the porous region which is a good electrical conductor.

Other features which are considered as characteristic for the invention are set forth in the appended claims.

Although the invention is illustrated and described herein as embodied in a method for fabricating a semiconductor component and semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 shows a detail from a semiconductor body/wafer wherein the electrical conductivity has been increased in the region of the pores by filling the pores with an electrically conductive material;

FIG. 3 shows a semiconductor component according to the invention in accordance with a first embodiment of the invention.

DESCRIPTION OF THE PREFERRED EMBODIMENTS

Figure 1A:
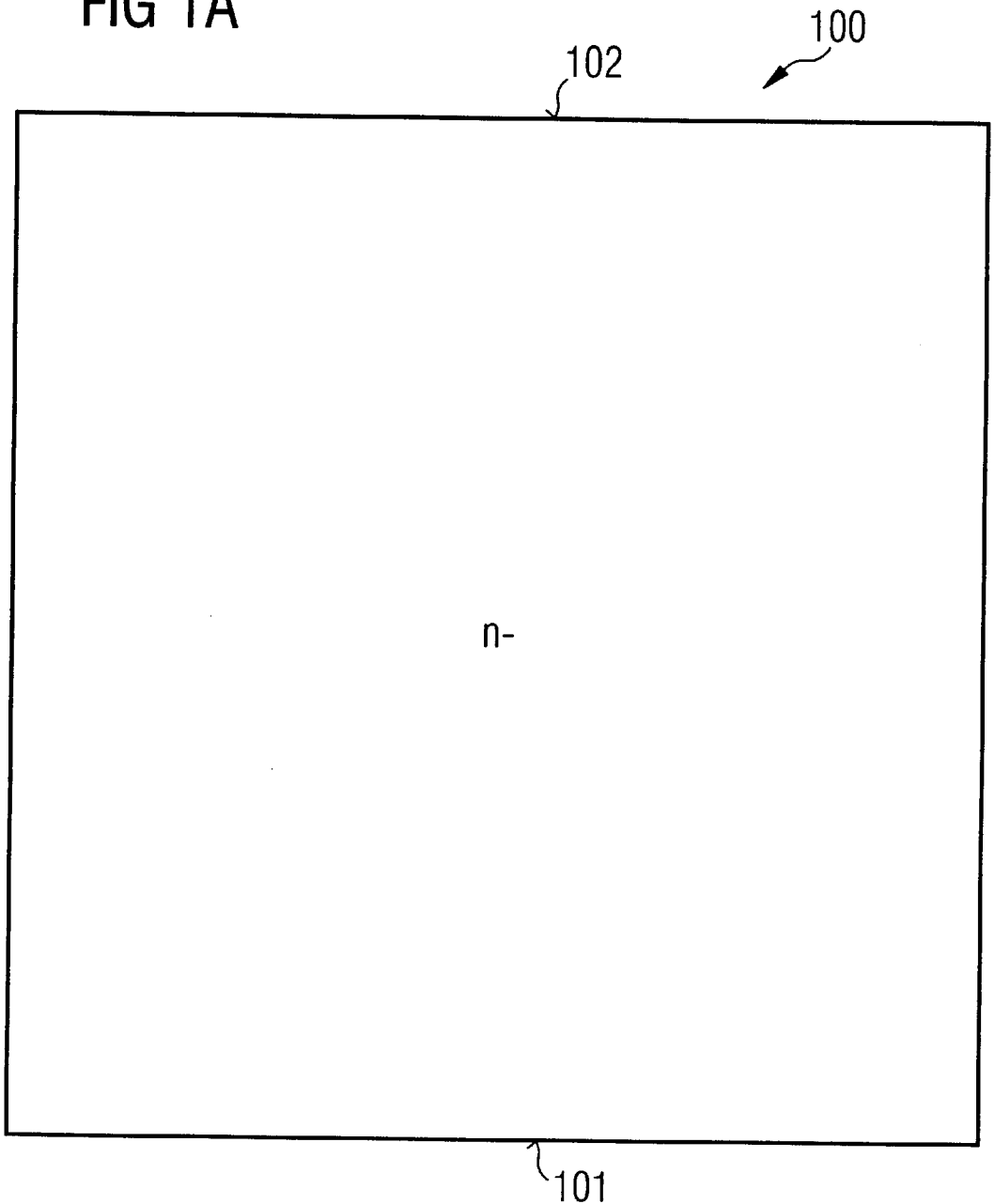
FIG. 1 (partial views FIG. 1A, FIG. 1B, and FIG. 1C) illustrates a detail from a semiconductor body/wafer during various method steps of a method according to the invention for fabricating a semiconductor component.

Referring now to the figures of the drawing in detail and first, particularly, to FIG. 1 thereof, there is shown a detail that illustrates method steps according to the invention during the fabrication of a semiconductor component. The figure shows a detail from a semiconductor body or wafer from which a multiplicity of the later semiconductor bodies/chips are sawn, in cross section.

In a first method step,-as illustrated in FIG. 1A, a semiconductor body 100 is provided which has a first surface 101 and a second surface 102.

Afterward, pores are produced in the semiconductor body 100 proceeding from the first surface 101, which pores end below the second surface 102 of the semiconductor body, as is illustrated in FIG. 1B. By way of example, the electrochemical macroporous etching method described in U.S. Pat. No. 4,874,484 and European patent application EP 0 296 348 A1 is suitable for fabricating the pores 103.

In addition, as is illustrated in FIG. 1C, the electrical conductivity of the semiconductor body is increased in the region of the pores 103. To that end, in accordance with a first embodiment of the method, it is provided that, proceeding from the first surface 101, dopant atoms, in particular donor atoms, are doped into regions of the semiconductor body 100 which are uncovered in the pores, and the dopant atoms are subsequently caused to diffuse into the semiconductor body by means of a thermal processing step. The diffusion depth and the spacings of adjacent pores 103 are preferably coordinated with one another in such a way that the regions lying between the pores are completely doped and subsequently have a high doping. In the example, the semiconductor body 100 illustrated in FIG. 1A is weakly n-doped at the beginning of the process, a heavy n-doping being effected in order to increase the electrical conductivity in the region of the pores 103.

In order to increase the electrical conductivity in the region of the pores provision may be made, in addition or as an alternative, for filling the pores 103 with an electrically conductive material, in particular a metal, for example copper, or polysilicon. FIG. 2 shows a semiconductor body 100 whose pores 103 have been filled with a conductive material 106.

In the exemplary embodiments illustrated in FIGS. 1 and 2, the region with increased electrical conductivity occupies a region 105 with a thickness d. A region 104 with a thickness x above the region 105 having increased electrical conductivity remains for the realization of active regions of semiconductor components. The thickness d is preferably greater than the thickness x and is, for example, between 50% and 95% of the total thickness of the semiconductor body (d+x).

The region 105 essentially contributes to the mechanical stability of a wafer during the fabrication of semiconductor components in the region 104, the extent of the wafer in the lateral direction exceeding the thickness d, or the sum of the thicknesses d and x, by several orders of magnitude. Consequently, the region having the thickness d essentially serves as carrier layer for the layer 104 wherein semiconductor components can be formed, as will be explained with reference to FIGS. 3 and 4. Furthermore, the region 105 serves as connection zone for said semiconductor components, the measure of increasing the electrical conductivity of the region 105 by doping and/or filling the pores 103 with a conductive material taking account of the endeavor having the intention that the connection zone 105 as far as possible does not contribute to increasing the electrical resistance of the semiconductor component.

The zone 104 of the semiconductor body acts like a thin substrate with which contact can be made in a low-impedance manner from the first surface 101 of the semiconductor body 100 via the zone 105.

In addition, this doping from the pores 103 has the effect that the lifetime for electron-hole pairs, generated by light for example, is very short in this region. As a result, very fast PIN diodes can be realized.

FIG. 3 shows in side view in cross section a diode which is integrated in a semiconductor body processed by a method in accordance with FIG. 1 or 2. Contact is made with the region 105 with the pores 103 by means of a contact layer 110, preferably a metal, applied to the first surface 101. Proceeding from the second surface 102, a p-doped zone 104A has been produced in the region 104 by means of methods that are adequately known, contact being made with said zone by means of a contact layer 112. The p-doped zone 104A forms the anode zone and the n-doped zone 104B forms the cathode zone of the diode. The original doping of the semiconductor body 100 is preferably chosen in such a way that it is suitable for forming the later cathode zone 104B of the diode.

Figure 4:
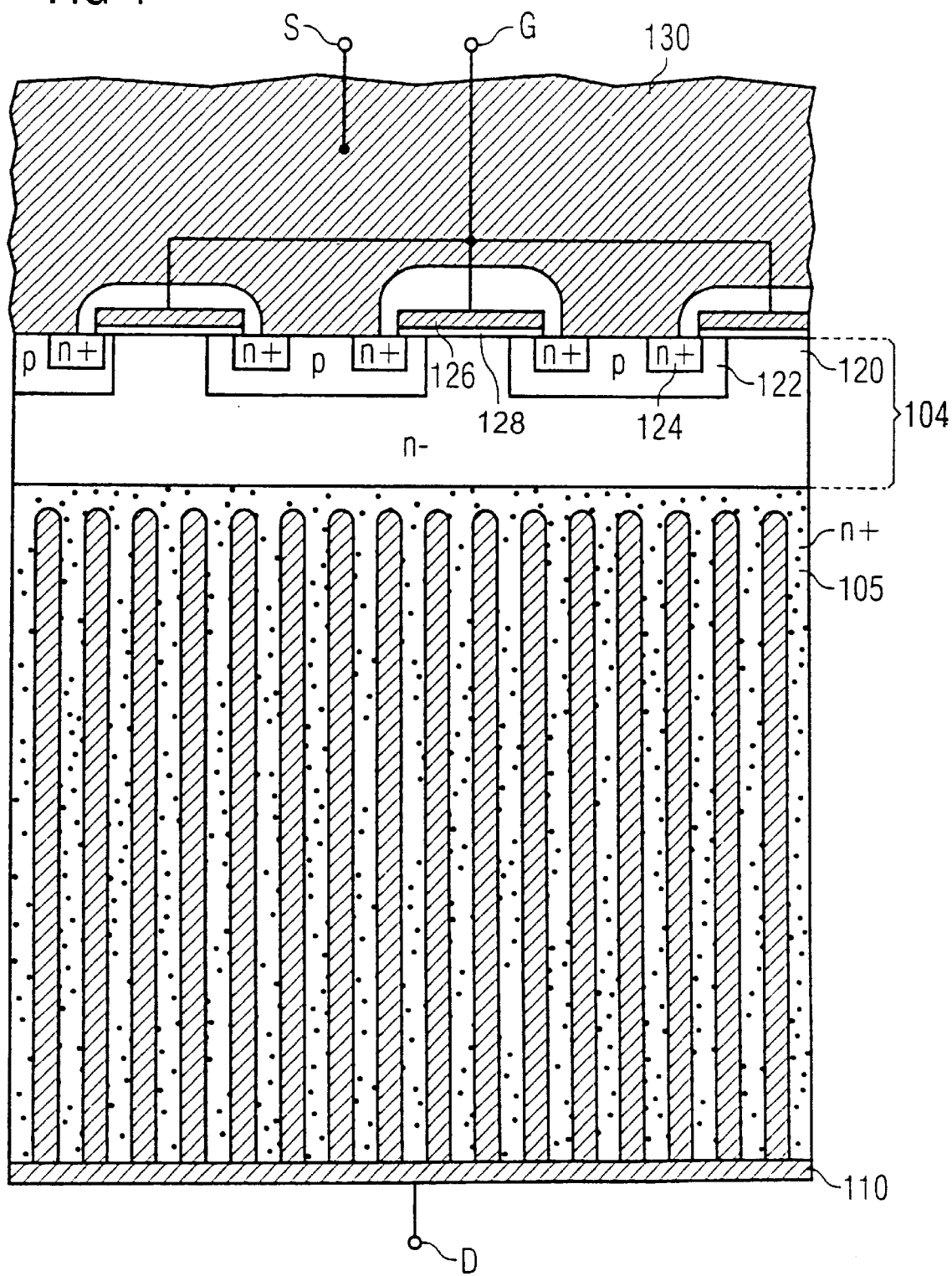
FIG. 4 shows a semiconductor component according to the invention in accordance with a second embodiment of the invention.

FIG. 4 shows in side view in cross section a vertical MOS transistor which is integrated in a semiconductor body processed by means of a method in accordance with FIG. 1 or 2. In order to fabricate the transistor, p-doped body zones 122 have been introduced into the n-doped zone 104, heavily n-doped source zones 124 having been introduced, in turn, into said body zones. The source zones 124 and the body zones 122 are short-circuited by means of a source electrode 130 applied to the second surface 102 of the semiconductor body 100. A section 120 of the zone 104 forms the drift zone of the MOS transistor, with which contact is made by a connection layer 110, which is applied on the first surface 101 and forms the drain electrode, via the porous region 105. Furthermore, gate electrodes 126 are provided above the second surface 102 of the semiconductor body 100 and are insulated from the semiconductor body 100 and the source electrode 130 by means of insulation layers 128.

In the case of the MOS transistor in accordance with FIG. 4, the semiconductor body is doped in the region of the pores 103 and the pores 103 are filled with an electrically conductive material. The original doping of the semiconductor body 100 is chosen in such a way that it is suitable for forming the drift zone 120.

Whereas it has been assumed in the above description that the active regions of the semiconductor components are produced after the fabrication of the pores 103, it is also possible, of course, to fabricate the active regions of the semiconductor components before the production of the pores 103 in the semiconductor body 100.

The method according to the invention, wherein the conductivity of a semiconductor material is increased by fabricating pores and increasing the electrical conductivity in the region of the pores, is suitable for the fabrication of any desired vertical semiconductor components, the semiconductor body having the pores and having increased conductivity serving as replacement for known carrier materials, including epitaxial materials.

We claim:

1. A method of fabricating a vertical semiconductor component, which comprises the following steps:

providing a semiconductor body with a first and a second surface;

fabricating a multiplicity of pores in the semiconductor body, the pores proceeding from the first surface, extending into the semiconductor body, and ending within the semiconductor body;

increasing an electrical conductivity of the semiconductor body in the region of the pores for producing a low ohmic connection zone including the pores and the semiconductor material surrounding the pores; and producing active regions with pn-junctions in a region not permeated by the pores and adjacent the second surface, the active regions to be contacted by the first surface over the low ohmic connection zone.

2. The method according to claim 1, which comprises doping regions of the semiconductor body that are uncovered in the pores.

3. The method according to claim 2, which comprises carrying out a diffusion step following the doping step.

4. The method according to claim 1, which comprises at least partly filling the pores with an electrically conductive material.

5. The method according to claim 1, which comprises at least partly filling the pores with a material selected from the group consisting of metal and polysilicon.

6. The method according to claim 1, wherein the semiconductor body has a given thickness and the pores are fabricated to extend into the semiconductor body to a depth of between 50% and 95% of the given thickness of the semiconductor body.

7. A vertical semiconductor component, comprising:

a semiconductor body having a first surface and a second surface each having connection contacts;

a multiplicity of pores formed in said semiconductor body, said pores extending into said semiconductor body, proceeding from said first surface and ending within said semiconductor body; and semiconductor material surrounding said pores, said semiconductor material surrounding said pores having an electrical conductivity being increased to form a low ohmic connection zone including said pores and said semiconductor material surrounding said pores; and active regions with pn-junctions, said active regions formed in a region not permeated by the pores and adjacent the second surface, said active regions to be contacted by said first surface over said low ohmic connection zone.

8. The semiconductor component according to claim 7, wherein said semiconductor body is doped at sidewalls of said pores.

9. The semiconductor component according to claim 7, which comprises an electrically conductive material at least partly filling said pores.

10. The semiconductor component according to claim 9, wherein said electrically conductive material is a material selected from the group consisting of metal and polysilicon.

11. The semiconductor component according to claim 7, wherein said semiconductor body has a given thickness and said pores extend into said semiconductor body to a depth of between 50% and 95% of said given thickness of said semiconductor body.

* * * * *